US007157744B2

(12) United States Patent
Palmteer et al.

(10) Patent No.: US 7,157,744 B2
(45) Date of Patent: Jan. 2, 2007

(54) SURFACE MOUNT PACKAGE FOR A HIGH POWER LIGHT EMITTING DIODE

(75) Inventors: William J. Palmteer, N. Andover, MA (US); Thomas Yuan, Nashua, NH (US); Richard Koba, Saugus, MA (US)

(73) Assignee: M/A-COM, Inc., Lowell, MA (US)

( * ) Notice: Subject to any disclaimer, the term of this patent is extended or adjusted under 35 U.S.C. 154(b) by 32 days.

(21) Appl. No.: 10/696,005

(22) Filed: Oct. 29, 2003

(65) Prior Publication Data

US 2005/0093116 A1 May 5, 2005

(51) Int. Cl.
*H01L 29/22* (2006.01)
*H01L 29/227* (2006.01)
*H01L 33/00* (2006.01)
*H01L 23/48* (2006.01)

(52) U.S. Cl. .......................... 257/98; 257/99; 257/414; 257/680

(58) Field of Classification Search ................. 257/98, 257/99, 414, 680
See application file for complete search history.

(56) References Cited

U.S. PATENT DOCUMENTS 3,581,162 A 5/1971 Wheatley .................... 317/234
4,897,711 A 1/1990 Blonder et al. ............... 357/74
5,323,025 A 6/1994 Ito et al. ........................ 257/81
5,404,368 A 4/1995 Makita et al. ................ 372/36
5,475,241 A 12/1995 Harrah et al. ................. 257/99
5,861,637 A 1/1999 Oishi .......................... 257/98
6,184,544 B1 * 2/2001 Toda et al. ................... 257/98
6,326,647 B1 12/2001 Chiu ........................... 257/99
6,327,285 B1 12/2001 Wang .......................... 372/36
6,355,946 B1 * 3/2002 Ishinaga ...................... 257/98
6,610,563 B1 * 8/2003 Waitl et al. ................. 438/166
6,614,103 B1 * 9/2003 Durocher et al. ........... 257/678
2002/0013990 A1 2/2002 Yeh ............................ 29/412
2002/0179919 A1 * 12/2002 Deisenhofer et al. ......... 257/99
2004/0190836 A1 * 9/2004 Kilian ......................... 385/92
2004/0211970 A1 * 10/2004 Hayashimoto et al. ........ 257/98

FOREIGN PATENT DOCUMENTS

JP 361056471 A 3/1986
JP 06232457 A * 2/1993

OTHER PUBLICATIONS

Compound Semiconductor—Compound Semiconductor magazine—“LED package designs tackle lumen depreciation issues,” compoundsemiconductor.net, pp. 1-4, May 16, 2003.

* cited by examiner

*Primary Examiner*—Nitin Parekh

(57) ABSTRACT

A package for a light emitting diode (LED) including an electrically insulating substrate layer, a non-conductive layer disposed on the electrically insulating substrate layer, and a reflector layer disposed on the non-conductive layer. The electrically insulating layer includes metallized portions for coupling a light emitting diode thereto.

13 Claims, 3 Drawing Sheets

300
310
330
320

SURFACE MOUNT PACKAGE FOR A HIGH POWER LIGHT EMITTING DIODE

FIELD OF THE INVENTION

This present invention relates to Light Emitting Diodes (LEDs), and in particular, to a surface mount package for a high power LED.

BACKGROUND OF THE INVENTION

Light Emitting Diodes (LEDs) have become extremely popular in today's telecommunications industry. There is a continuing effort to make smaller LEDs, thus permitting the manufacture of more LEDs per semiconductor wafer. Obviously, the inclusion of more LEDs on a dingle semiconductor wafer results in a significant manufacturing cost reduction. A factor limiting the reduction in size of LEDs is the placement of electrical connections at specific locations on the LED. Such electrical connections are necessary to couple the LED to the package in which the LED will eventually be placed.

As is well known in the art, LEDs are often packaged in leadframes which permit the efficient connection of other electrical components to the LED, and assist in channeling light emitted by the LED through the use of a lens. Often times, the lens of the LED package is spherical in shape, and the package geometry is matched to the dimensions of the lens. For example, some LED packages include portions which are conical in shape to effectively receive and hold spherical lenses (see, for example, FIG. 9 of U.S. Pat. No. 4,987,711). However, conventional LED packages for receiving spherical lenses are expensive and difficult to produce using automated processes.

Thus, there is presently a need for an new LED package which is inexpensive to manufacture and easy to produce using automated processes.

SUMMARY OF THE INVENTION

An exemplary embodiment of the present invention comprises a semiconductor package including an electrically insulating substrate layer, a non-conductive layer disposed on the electrically insulating substrate layer, and a reflector layer disposed on the non-conductive layer.

An exemplary embodiment of the present invention also comprises a method for producing a semiconductor package, including the steps of applying a non-conductive layer to a metal reflector layer, and applying an electrically insulating layer including at least one metallized area to the non-conductive layer.

An exemplary embodiment of the present invention also comprises a light emitting device including an electrically insulating substrate layer with at least one light emitting diode disposed thereon, a non-conductive layer disposed on the electrically insulating substrate layer, and a reflector layer disposed on the non-conductive layer.

BRIEF DESCRIPTION OF THE DRAWINGS

FIG. 1(*b*) shows a cross-sectional view of the reflector layer of FIG. 1(*a*) taken along lines A—A.

FIG. 1(*c*) shows a bottom view of the reflector layer of FIG. 1(*a*).

FIG. 2(*b*) shows a front side view of the electrically insulating layer of FIG. 2(*a*).

FIG. 2(*c*) shows a bottom view of the electrically insulating layer of FIG. 2(*a*).

FIG. 2(*d*) shows a right side view of the electrically insulating layer of FIG. 2(*a*).

FIG. 3(*b*) shows an exploded cross section view of the LED package of FIG. 3(*a*) taken along lines A—A.

FIG. 3(*b*) shows a bottom view of the LED package of FIG. 3(*a*).

DETAILED DESCRIPTION

The present invention comprises, in one exemplary embodiment, a surface mount Light Emitting Diode (LED) package, preferably constructed of an electrically insulating (e.g., ceramic) layer, a non-conductive/dielectric (e.g., glass) layer and a metal reflector layer. The electrically insulating layer preferably includes pattern metallization thereon that allows die and wire attachment of an LED die on its top face. The electrically insulating layer also preferably includes electrical terminations suitable for brazed leads or surface mount soldering on its backside. The electrically insulating layer enables electrical isolation of the two leads of the LED (e.g., anode and cathode), the ability to withstand high temperatures during assembly and operation, resistance to damage by intense Ultraviolet(UV) radiation, and structural stability. The pattern metallization on the electrically insulating layer may be designed in such a way as to accept LED dies that are intended to be backside die attached, or 'flip-chip' mounted, onto the electrically insulating layer (See FIGS. 2(*a*)–2(*d*)).

If the LED die is backside die attached as discussed above, then the electrically insulating layer pattern metallization may be designed to accept an LED die backside that comprises one electrode of the LED (thus requiring only one wire bond off the top of the LED), or an LED die backside that is electrically insulating (thus requiring two wire bonds off the top of the LED die).

Figure 1A:
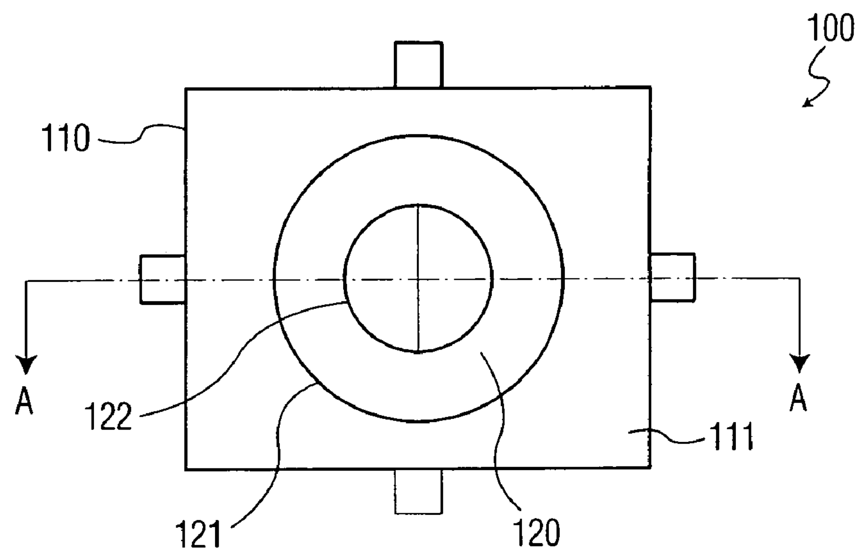
FIG. 1(*a*) shows a top view of a reflector layer according to an exemplary embodiment of the present invention.
Figure 1B:
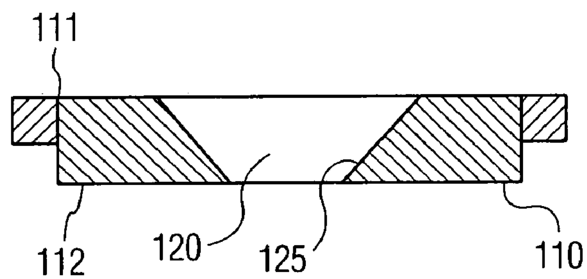
Figure 1C:
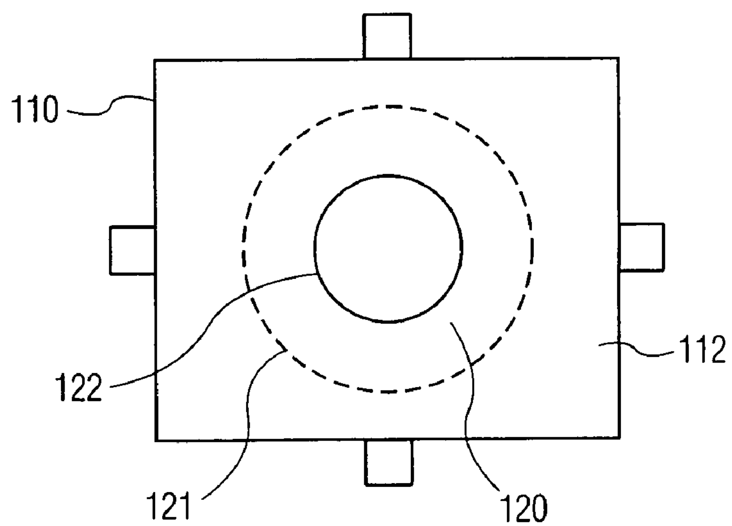
Figure 2A:
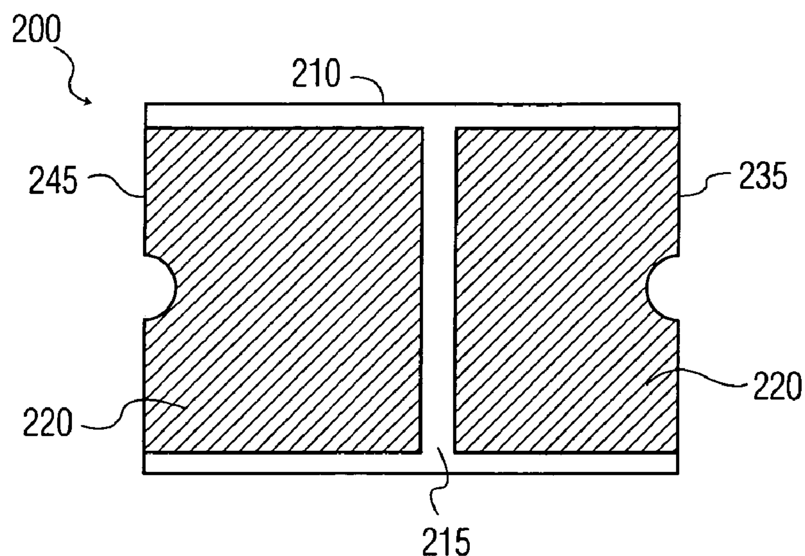
FIG. 2(*a*) shows a top view of an electrically insulating layer according to an exemplary embodiment of the present invention.
Figure 2B:
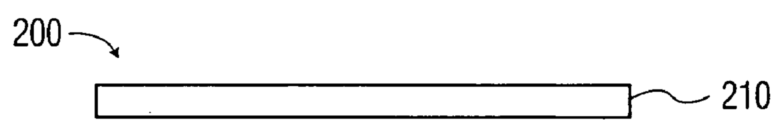
Figure 2C:
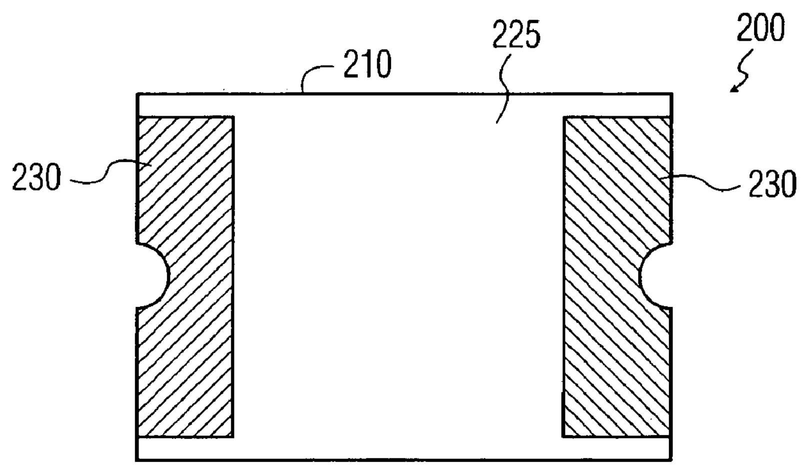
Figure 2D:
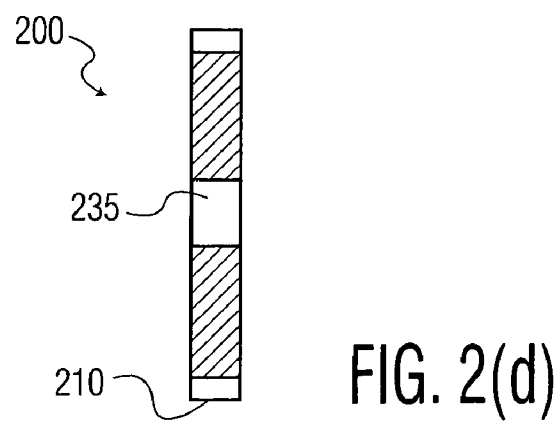

FIGS. 1(*a*)–(*c*) show a metal reflector layer 100 according to an exemplary embodiment of the present invention. FIG. 1(*a*) is a top view of the reflector layer 100 showing a base portion 110 including a centrally-disposed cup portion 120 for receiving a lens or the like. The cup portion 120 is comprised of a first circular opening 121 on a first (upper) surface 111 of the reflector layer 100, and a second circular opening 122 on a second (lower) surface 112 of the reflector layer. FIG. 1(*b*) shows a cross section of the reflector layer 100 taken along line A—A in FIG. 1(*a*). FIG. 1(*b*) shows that the first and second circular openings 121, 122 are connected by a substantially conical wall 125. FIG. 1(*c*) shows a view from the bottom (underside) of the reflector layer 100.

FIGS. 2(*a*)–(*d*) show an electrically insulating (e.g., ceramic) layer 200 according to an exemplary embodiment of the present invention. FIG. 2(*a*) is a top view of the electrically insulating layer 200 showing a main body portion 210, which is metallized in certain areas 220 on a top surface 215 thereof. FIG. 2(*b*) is a front side view of the electrically insulating layer 200. FIG. 2(*c*) is a bottom view of the electrically insulating layer 200 showing additional metallized areas 230 on a bottom surface 225 of the main body portion 210. FIG. 2(*d*) is a right side view of the electrically insulating layer 200 showing more metallized areas 240 on a right side surface 235 of the main body portion 210. Although not shown in the figures, a left side surface 245 of the main body portion 210 also includes metallized areas 250.

Figure 3A:
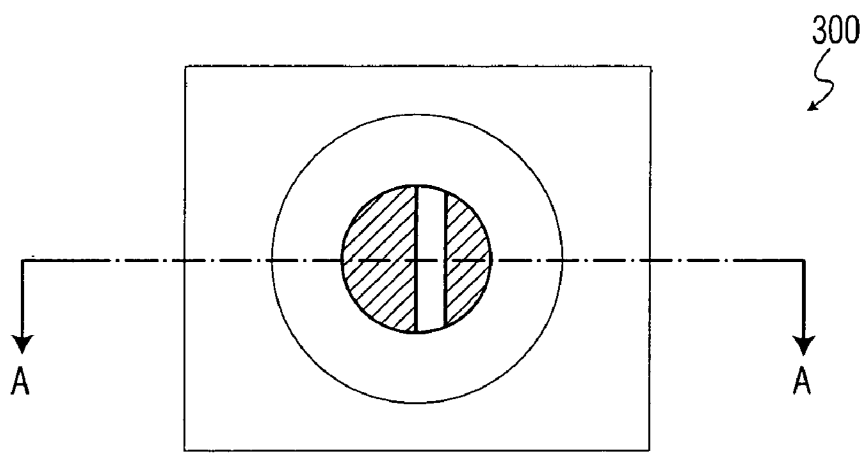
FIG. 3(*a*) shows a top view of an LED package according to an exemplary embodiment of the present invention.
Figure 3B:
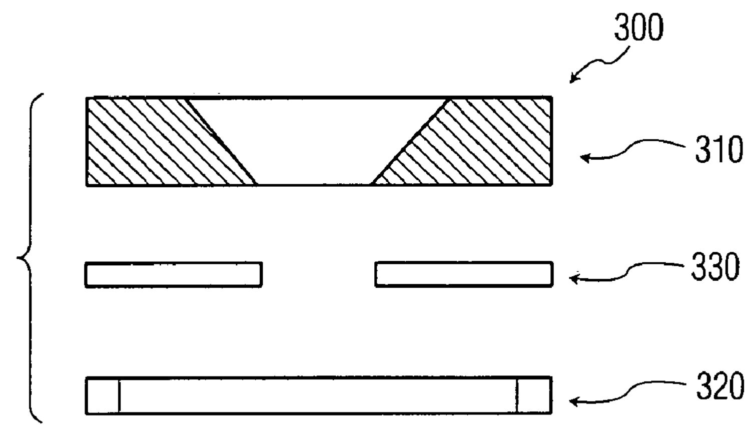
Figure 3C:
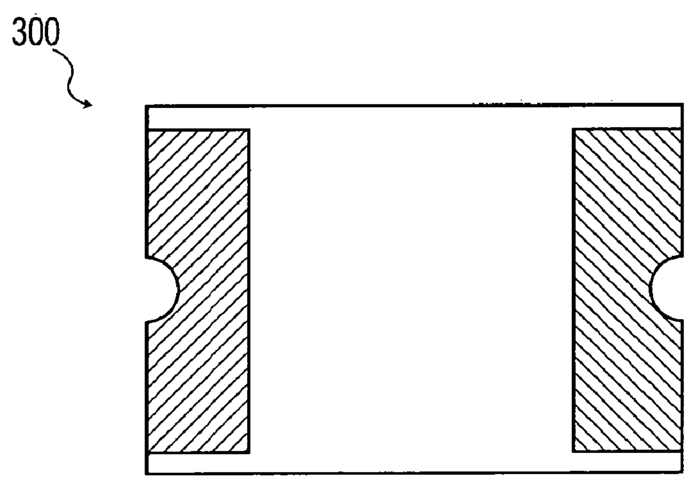

FIGS. 3(*a*)–(*c*) show an LED package 300 according to an exemplary embodiment of the present invention. The LED package 300 is essentially comprised of a reflector layer 310 (shown and described with reference to FIGS. 1(*a*)–1(*c*)), an electrically insulating layer 320 (shown and described with reference to FIGS. 2(*a*)–2(*d*)), and a dielectric (i.e., non-conductive) layer 330. The dielectric layer 330 may comprise materials such as glass, epoxy, or any non-conductive material.

The reflector layer 310 may be attached on the electrically insulating layer 320 to surround the LED die. The purpose of the reflector layer 310 is to efficiently direct the emitted light from the LED upward, protect the LED die, and contain the encapsulant for the retaining the lens. The encapsulant may be epoxy, silicon rubber, glass and/or metals. The reflector layer 310 should preferably have a parabolic or conical internal diameter for receiving a spherical lens. The top surface of the reflector layer 310 (e.g., reference 111 in FIGS. 1(*a*)–1(*c*)) may include machined features that promote alignment and placement of a lens over the LED die. The surface of the reflector layer 310 may be coated with, or comprised of, silver, palladium or aluminum. Preferably, the reflector layer 310 is made from a metal whose Coefficient of Thermal Expansion (CTE) is matched to the CTE of the electrically insulating layer 320.

The dielectric layer 330 may be interposed between the electrically insulating layer 320 and the metal reflector layer 310 to prevent electrical continuity between the two metallized pads atop the electrically insulating layer (see reference numerals 220 in FIG. 2(*a*)). The dielectric layer 330 may be the same as the electrically insulating layer 320 (co-fired or post-fired), requiring that the metal reflector layer 310 be bonded to the electrically insulating layer with a metal braze or glass. If the dielectric layer 330 is a silicate glass or a polymer (e.g., epoxy), the dielectric layer may also serve as an adhesive between the electrically insulating layer 320 and the metal reflector layer 310.

The electrically insulating layer 320 may be manufactured in either single units or an array (e.g., multi-up card). Additionally, the electrically insulating layer 320 may be bonded to the metal reflector layer 310 as discrete units or in array form. The material of the electrically insulating layer 320 may be alumina ($Al_2O_3$), aluminum nitride (AIN), or other suitable ceramic. Alumina is typically a lower cost material, and is preferred when the dissipated power of the LED is low. AIN is typically the higher cost material, but is preferred when the dissipated power of the LED is high. If alumina is selected, the CTE matched metal reflector layer 310 may be Alloy 46 or certain compositions of Aluminum-Silicon Carbide (AlSiC). If AIN is selected, the CTE-matched metal reflector layer 310 may be Kovar® or Alloy 42.

The metallization pattern on the electrically insulating layer 320 should connect the two pads (e.g., reference numerals 220 in FIG. 2(*a*)) on the top of the electrically insulating layer to the two pads (e.g., reference numerals 230 in FIG. 2(*c*)) on the backside. Methods of connecting the two front-side pads to the two backside pads include bore-coated castellations (of various shapes), and hermetic and non-hernetic vias.

The metallization pattern on electrically insulating layer 320 should also be adherent to the material of the electrically insulating layer (e.g., alumina), capable of withstanding package assembly process, and compatible with the LED die attach process (epoxy or solder) and wire bonding (Gold (Au) or Aluminum (Al) wire) of the LED die to the package. Two general methods may be used to metallize the electrically insulating layer 320: thick film or thin film. Each is described below.

Thick film metallization offers the advantage of being directly deposited onto the electrically insulating layer 320 in the desired pattern. Thin film metal may include a variety of post-fired metallization pastes such as Silver (Ag) or Gold (Au). Ag or Au thick film metallization has the advantage of being directly adherent to the electrically insulating material (e.g., alumina), and not requiring subsequent plating. Alternatively, refractory metal can be screened onto the electrically insulating layer 320 either before or after the layer is sintered. The co-fired thick film metal is typically Tungsten (W), which enables the creation of hermetic vias. Post-fired refractory metallization can include W, Tungsten-Manganese (W/Mn) or Molybdenum-Manganese (Mo/Mn). All refractory metallization require plating of metals required to support die attach. Typical plated metal layer stacks can include Nickel-Silver (Ni/Ag), Nickel-Palladium (Ni/Pd) or Nickel-Gold (Ni/Au). However, for optimal reflectivity, the preferred outermost metal should be Silver (Ag) or Palladium (Pd).

Thin film metallization offers the advantage of offering aluminum metallization, and potentially finer line width control. As is well known, thin films may be deposited by methods such as sputtering or evaporation. Typical thin film systems compatible with ceramic include Titanium-Platinum-Gold (Ti/Pt/Au), Titanium-Tungsten-Gold (Ti/W/Au), Titanium-Platinum-Silver (Ti/Pt/Ag) or Titanium-Tungsten-Silver (Ti/W/Ag). Sputtered or evaporated aluminum may exhibit sufficient adhesion to bare alumina or AIN. Thin film metal may be patterned by deposition through a shadow mask or photoresist mask, or by a subtractive (etch) process, where the metal to be etched away is defined by photoresist.

If the backside of the electrically insulating layer 320 requires metal leads, one method to attach these leads would be to braze the leads discrete ceramic bases using a metal braze alloy such as Copper-Silver (CuAg) eutectic. This lead attachment step may be, but need not necessarily be, performed prior to bonding the reflector layer 310 to the top face of the electrically insulating layer 320.

The metal reflector layer 310 may be formed from a sheet of CTE-matched metal such as Alloy 46 or Kovar® (manufactured by Carpenter Technology Corporation of Reading, Pa.), preferably 20 mils (0.5 mm) thick. Two methods may be used to form the sheet metal: photoetching or stamping. Photoetching of metal sheets is commonly practiced in the industry using dry film photoresist. If photoresist is patterned on only one face of the metal, wet (isotropic) etching of the metal will naturally produce a side wall whose profile is the 90° arc of a circle. However, if photoresist is aligned and patterned on both faces of the metal sheet, then more conical-shaped profile can be engineered. Stamping of sheet metal is preferred when the desired quantities are very high. By using of progressive stamping or forging, the profile of reflector concial wall 125 may be controlled. After forming, the metal can be surface treated to prepare it for bonding to the electrically insulating layer 320. For example, the reflector layer 310 may be electroplated with Nickel (Ni), or an alloy of Nickel and Silver (Ni+Ag) to prepare it to be brazed or glass bonded to the electrically insulating layer 320. Alternatively, the reflector layer 310 be oxidized to prepare it to be glass bonded to the electrically insulating layer 320.

An alternative material for the reflector layer 310 could be one of the many types of aluminum matrix composites tailored to have a low CTE. The CTE of the composite can be reduced by the addition of Silicon Carbide (SiC) particles (AlSiC), SiC whiskers, silicon particles, or graphite fiber. For example, Ixion Thermal Materials, LLC (of Chattanooga, Tenn.) manufactures an AlSiC composition called "MCX724" whose CTE is matched to that of alumina (e.g., 7.2 parts per million (ppm)/° C.).

An alloy of Silicon and Aluminum (Si/Al) or Graphite and Aluminum (Graphite/Al) may be machined, photoetched or stamped into the desired shape. AlSiC can be net-shaped cast into the desired shape, however, an expensive Non-Refundable Engineering charge (NRE) for design and manufacture of the net-shaped casting molds, increases the cost of production. The advantage of an aluminum matrix composite reflector layer 310 is that that it requires no plating before or after it is bonded to the electrically insulating layer 320 (preferably using a low temperature sealing glass), since aluminum is a preferred reflector material and it does not tarnish. Ideally, an aluminum composite reflector layer 310 may be sealed to the electrically insulating layer 320 using a glass sealing temperature greater than 300° C. (to enable the LED to be soldered with the Gold-Tin (AuSn) eutectic), but less than 500° C. to prevent excessive alloying of the Gold (Au) or Silver (Ag) plating on the electrically insulating layer.

The metal reflector layer 310 may be etched into the shape of a 2-D array of reflectors. The array can either be (a) tightly spaced together to enable bonding to a electrically insulating multi-up card, or (b) widely separated as on an over-molded leadframe. If the metal reflector/dielectric/electrically insulating sandwich is bonded together as a card, then the sandwich layers must be singulated with a diamond saw, preferably after die attach and wire bonding. If the electrically insulating layer 320 is singulated before bonding to the metal reflector layer 310, then diamond sawing through the electrically insulating layer only is necessary. After the discrete electrically insulating layers are bonded to the metal lead frame, the metal leadframe can be quickly singulated using an excising punch.

The use of glass to bond the metal reflector layer 310 to the electrically insulating layer 320 offers the advantage of providing dielectric isolation and adhesion in a single step. The selected glass should have a CTE similar to that of the electrically insulating layer and the metal reflector layer, and should have a softening point above 300° C., to enable Gold-Tin (AuSn) die attach of the LED to the electrically insulating layer 320, followed by Tin-Silver (SnAg) wave soldering of the packaged LED.

The upper temperature limit of the working temperature of the glass is also set by other factors. If a metal alloy such as Alloy 46 or Kovar® are used for the reflector layer 310, the glass should be flowed at a temperature below which the thermal expansion coefficient of the metal. In such cases, the LED package 300 will likely be silver plated after assembly. If an aluminum-matrix composite is used as the metal reflector layer 310, then the metallization on the electrically insulating layer 320 (e.g., Silver (Ag) or Gold (Au)) must not be degraded in the process of bonding the electrically insulating layer to the metal reflector layer 310. The glass reflow temperature should be less than 500° C. if the electrically insulating layer's Silver (Ag) or Gold (Au) metallization is not to be degraded.

A polymer such as high temperature epoxy could also be used to bond the metal reflector layer 310 to the electrically insulating layer 320. Epoxy bonding of the metal reflector layer 310 to the electrically insulating layer 320 would be especially suitable if the LED is to be attached to the electrically insulating layer 320 using a lower temperature, silver-filled epoxy. Generally, it is easier to control the flow of epoxy than silicate glass.

A purpose of this invention is to provide an LED package design that is compatible with existing automated methods for die attach and wire bonding. In order to meet the high volume & low unit cost demands of the LED industry, the LED dice must be die attached and wire bonded using highly automated equipment, with a minimum of manual input. The use of industry standard leadframes is a key feature of this invention, since automated equipment in factories worldwide routinely accept plastic over-molded packages on standard leadframes.

An LED die may be bonded to the electrically insulating layer 320 using a silver-filled epoxy, or a metal solder with good thermal conductivity such as 80:20 Gold-Tin (AuSn) eutectic.

Metal pads atop the LED die are connected to the electrically insulating layer 320, typically using 1 mil diameter gold wire. Gold ball bonding or wedge bonding are also suitable.

After a frame is fully populated with die, it can be moved to another work station where encapsulant and a lens are automatically placed atop the die. Features formed into the top of the metal (such as a ledge) can assist in the alignment of the lens.

The process for forming the above-described LED package 300 will now be discussed. First, the dielectric layer 330 is applied to the underside of the metal reflector layer 310. As mentioned above, the material of the dielectric layer may be glass, epoxy, or any non-conductive material. The dielectric layer 330 may be applied to the metal reflector layer 310 by screening, spraying, roller coating, etc.

Next, the pattern metallized, electrically insulating layer 320 is placed onto the dielectric layer 330 that was previously deposited on the underside of the metal reflector layer 310. The LED package 300 is now ready for automated die and wire bond attachment. The leadframe may now be singulated into individual pieces by using a punch to remove the tie bars that hold the individual units into the leadframe.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. A semiconductor package comprising:

an electrically insulating substrate layer;

a non-conductive layer disposed on the electrically insulating substrate layer; and, a reflector layer disposed on the non-conductive layer, wherein the electrically insulating substrate layer includes at least one first metallized portion on a first surface thereof and at least one second metallized portion on a second surface thereof, said second surface opposite said first surface, and wherein the reflector layer is made of a metal with a coefficient of thermal expansion which is matched to a coefficient of thermal expansion of a material of the electrically insulating substrate layer.

2. The semiconductor package of claim 1, wherein the reflector layer includes a conical portion.

3. The semiconductor package of claim 1, wherein the non-conductive layer is made of glass.

4. The semiconductor package of claim 3, wherein the glass has a coefficient of thermal expansion which is matched to a coefficient of thermal expansion of the material of the electrically insulating substrate layer.

5. The semiconductor package of claim 4, wherein the glass and the material of the electrically insulating substrate layer both have a coefficient of thermal expansion which is matched to a coefficient of thermal expansion of the metal reflector layer.

6. The semiconductor package of claim 1, wherein the reflector layer is made of a material comprising metal, said reflector layer material having a coefficient of thermal expansion which is matched to a coefficient of thermal expansion of the material of the electrically insulating substrate layer.

7. The semiconductor package of claim 1, wherein the reflector layer is made of a metal-composite material comprising metal and at least one other material, said metal-composite material having a coefficient of thermal expansion which is matched to a coefficient of thermal expansion of the material of the electrically insulating substrate layer.

8. The semiconductor package of claim 1, wherein the reflector layer is made of a metal-alloy, said metal-alloy having a coefficient of thermal expansion which is matched to a coefficient of thermal expansion of the material of the electrically insulating substrate layer.

9. A light emitting device comprising:

an electrically insulating substrate layer with at least one light emitting diode disposed thereon;

a non-conductive layer disposed on the electrically insulating substrate layer; and, a reflector layer disposed on the non-conductive layer, wherein the electrically insulating substrate layer includes at least one first metallized portion on a first surface thereof and at least one second metallized portion on a second surface thereof, said second surface opposite said first surface, and wherein the reflector layer is made of a metal with a coefficient of thermal expansion which is matched to a coefficient of thermal expansion of a material of the electrically insulating substrate layer.

10. The light emitting device of claim 9, wherein one of the at least one first and second metallized portions are coupled to the light emitting diode.

11. The light emitting device of claim 9, wherein the reflector layer is made of a material comprising metal, said reflector layer material having a coefficient of thermal expansion which is matched to a coefficient of thermal expansion of the material of the electrically insulating substrate layer.

12. The light emitting device of claim 9, wherein the reflector layer is made of a metal-composite material comprising metal and at least one other material, said metal-composite material having a coefficient of thermal expansion which is matched to a coefficient of thermal expansion of the material of the electrically insulating substrate layer.

13. The light emitting device of claim 9, wherein the reflector layer is made of a metal-alloy, said metal-alloy having a coefficient of thermal expansion which is matched to a coefficient of thermal expansion of the material of the electrically insulating substrate layer.

* * * * *